United States Patent
Tomita et al.

(10) Patent No.: US 8,987,041 B2
(45) Date of Patent: Mar. 24, 2015

(54) METHOD FOR MANUFACTURING SOLID-STATE IMAGING DEVICE

(75) Inventors: Ken Tomita, Iwate-ken (JP); Atsushi Sasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 259 days.

(21) Appl. No.: 13/417,567

(22) Filed: Mar. 12, 2012

(65) Prior Publication Data

US 2012/0329201 A1    Dec. 27, 2012

(30) Foreign Application Priority Data

Jun. 23, 2011    (JP) .................................. 2011-139335

(51) Int. Cl.
| | | |
|---|---|---|
| H01L 21/00 | (2006.01) | |
| H01L 27/148 | (2006.01) | |
| H01L 27/146 | (2006.01) | |
| H01L 31/0352 | (2006.01) | |
| H01L 31/103 | (2006.01) | |

(52) U.S. Cl.
CPC .... *H01L 27/14812* (2013.01); *H01L 27/14689* (2013.01); *H01L 27/14643* (2013.01); *H01L 27/14603* (2013.01); *H01L 27/1463* (2013.01); *H01L 27/14609* (2013.01); *H01L 31/03529* (2013.01); *H01L 31/103* (2013.01)
USPC ................ 438/75; 438/60; 438/144; 438/525

(58) Field of Classification Search
CPC ................... H01L 27/14689; H01L 27/14603; H01L 27/14609; H01L 27/14643; H01L 27/1463
USPC .......... 257/E27.132, 292, E27.131, E27.133, 257/E31.084, E27.13; 438/48, 60, 75, 525, 438/144, 302, 305
See application file for complete search history.

(56) References Cited

U.S. PATENT DOCUMENTS

| | | | | |
|---|---|---|---|---|
| 6,900,484 | B2 * | 5/2005 | Rhodes ......................... | 257/292 |
| 2005/0006676 | A1 * | 1/2005 | Watanabe ..................... | 257/290 |
| 2005/0098806 | A1 * | 5/2005 | Rhodes ......................... | 257/292 |
| 2007/0092986 | A1 * | 4/2007 | Chen et al. ..................... | 438/70 |

(Continued)

FOREIGN PATENT DOCUMENTS

| | | |
|---|---|---|
| JP | 2000-228515 A | 8/2000 |
| JP | 2003-264283 | 9/2003 |
| JP | 2007-500444 A | 1/2007 |

OTHER PUBLICATIONS

Office Action issued Jun. 3, 2014 in Japanese Patent Application No. 2011-139335 (with English language translation).

*Primary Examiner* — Bac Au
(74) *Attorney, Agent, or Firm* — Oblon, McClelland, Maier & Neustadt, L.L.P.

(57) ABSTRACT

Certain embodiments provide method for manufacturing a solid-state imaging device, including forming an electrode and forming a second impurity layer. The electrode is formed on a semiconductor substrate including a first impurity layer of a first conductivity type on a surface. The second impurity layer is a second conductivity type and is formed by implanting an impurity of a second conductivity type into the first impurity layer in an oblique direction with respect to the surface of the semiconductor substrate on the condition that the impurity penetrates an end portion of the electrode, based on a position of the electrode. The second impurity layer is bonded to the first impurity layer to constitute a photodiode, and a portion of the second impurity layer is disposed under the electrode.

14 Claims, 6 Drawing Sheets

(56) References Cited

U.S. PATENT DOCUMENTS

| | | | |
|---|---|---|---|
| 2007/0145438 A1* | 6/2007 | Adkisson et al. | 257/290 |
| 2007/0252184 A1* | 11/2007 | Ohkawa | 257/292 |
| 2007/0296844 A1* | 12/2007 | Tanaka | 348/311 |
| 2008/0179639 A1* | 7/2008 | Gambino et al. | 257/291 |
| 2010/0311200 A1* | 12/2010 | Hirota | 438/60 |
| 2011/0169993 A1* | 7/2011 | Rhodes | 348/311 |
| 2011/0177650 A1* | 7/2011 | Qian et al. | 438/75 |
| 2011/0298078 A1* | 12/2011 | Ha et al. | 257/443 |

* cited by examiner

METHOD FOR MANUFACTURING SOLID-STATE IMAGING DEVICE

CROSS REFERENCE TO RELATED APPLICATIONS

This application is based upon and claims the benefit of priority from the prior Japanese Patent Application No. 2011-139335 filed in Japan on Jun. 23, 2011; the entire contents of which are incorporated herein by reference.

FIELD

Embodiments described herein relate generally to method for manufacturing a solid-state imaging device.

BACKGROUND

A conventional solid-state imaging device converts light, which is detected by a pixel unit including a photodiode, into charges, and outputs the charges by transferring the converted charges by a charge transferring unit configured by a Charge Coupled Device (CCD) or a CMOS device. In the solid-state imaging device, a plurality of charge accumulating units extracting charges generated in the pixel unit, accumulating the extracted charges, and transferring the accumulated charges to the charge transferring unit, are formed between the pixel unit and the charge transferring unit.

The respective charge accumulating units are manufactured by forming an N-type impurity layer constituting a photodiode on a surface of a P-type semiconductor substrate such that the N-type impurity layer protrudes from the pixel unit, and then, forming a gate electrode such that the gate electrode overlaps a portion of a section in which the N-type impurity layer protrudes.

In the charge accumulating units manufactured in this manner, a residual image characteristic is dependent on a potential of the pixel unit, and is also dependent on a potential (charge reservoir) formed by the N-type impurity layer overlapping the gate electrode. Different residual image characteristics are required in different products.

However, since it is difficult to visually determine a position of the impurity layer, it is difficult to form the gate electrode based on the position of the impurity layer. Therefore, the position of the formed gate electrode varies. As a result, an area of a section in which the N-type impurity layer and the gate electrode overlap each other varies greatly in each charge accumulating unit, and a depth of the charge reservoir also varies greatly. Hence, a residual image characteristic in each charge accumulating unit varies, and a residual image characteristic in each product also varies.

BRIEF DESCRIPTION OF THE DRAWINGS

FIGS. 5A and 5B are views describing a method for reading charges from the pixel unit, in which FIG. 5A is an enlarged cross-sectional view of a portion of FIG. 2, and FIG. 5B illustrates potentials formed in the pixel unit and the charge accumulating unit;

DETAILED DESCRIPTION

Certain embodiments provide method for manufacturing a solid-state imaging device, including forming an electrode and forming a second impurity layer. The electrode is formed on a semiconductor substrate including a first impurity layer of a first conductivity type on a surface. The second impurity layer is a second conductivity type and is formed by implanting an impurity of a second conductivity type into the first impurity layer in an oblique direction with respect to the surface of the semiconductor substrate on the condition that the impurity penetrates an end portion of the electrode, based on a position of the electrode. The second impurity layer is bonded to the first impurity layer to compose a photodiode, and a portion of the second impurity layer is disposed under the electrode.

Hereinafter, a method for manufacturing a solid-state imaging device according to an embodiment will be described.

Figure 1:
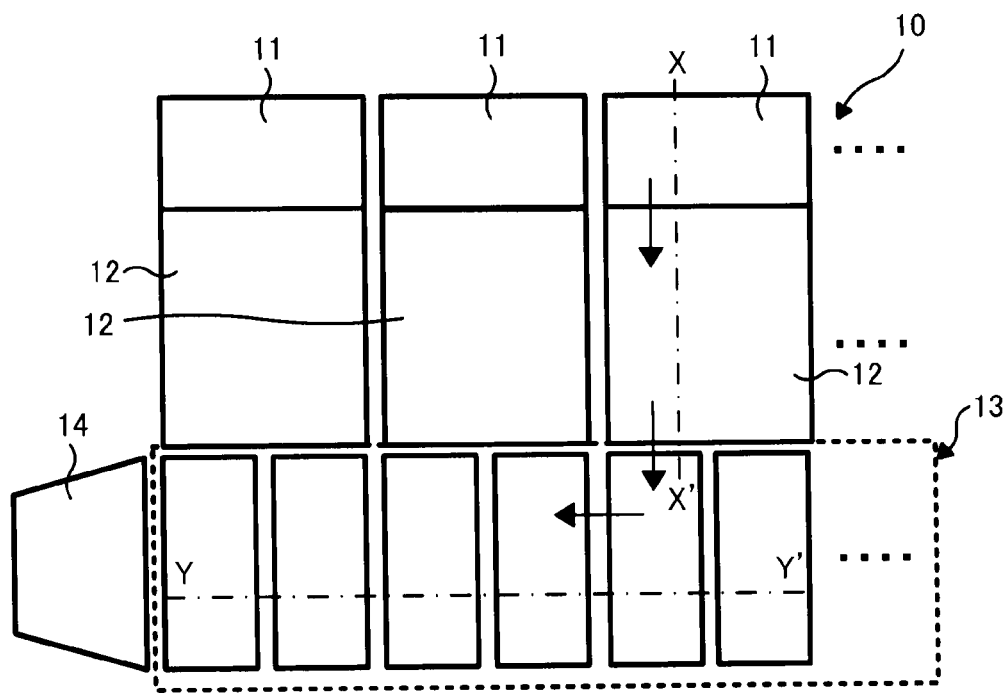
FIG. 1 is a top view schematically illustrating a solid-state imaging device manufactured by a method for manufacturing a solid-state imaging device according to an embodiment.

First, a solid-state imaging device manufactured by a method for manufacturing a solid-state imaging device according to an embodiment will be described with reference to FIG. 1. FIG. 1 is a schematic top view illustrating a main part of a solid-state imaging device. As illustrated in FIG. 1, a solid-state imaging device 10 includes a pixel unit 11, a charge accumulating unit 12, and a charge transferring unit 13 (hereinafter, referred to as a CCD unit 13), which are formed on a P-type semiconductor substrate made of, for example, silicon.

The pixel unit 11 includes a photodiode which generates charges in response to received light. The pixel unit 11, for example, is formed in plurality in a column shape in substantially parallel to the CCD unit 13, and the plurality of pixel units 11 are spaced apart from one another.

The charge accumulating unit 12 reads charges generated in the pixel unit 11, accumulates the read charges, and also transmits the accumulated charges to the CCD unit 13. The charge accumulating unit 12 is formed respectively between each of the pixel units 11 and the CCD unit 13.

The CCD unit 13 transfers the charges, which are transferred from the charge accumulating unit 12, to a floating diffusion unit 14 (FD unit 14), which is formed at a final stage of the CCD unit 13. The CCD unit 13 is formed in substantially parallel to the column of the pixel unit 11. In addition, the FD unit 14 is a charge voltage converting unit which outputs a voltage based on a transferred charge amount.

Figure 2:
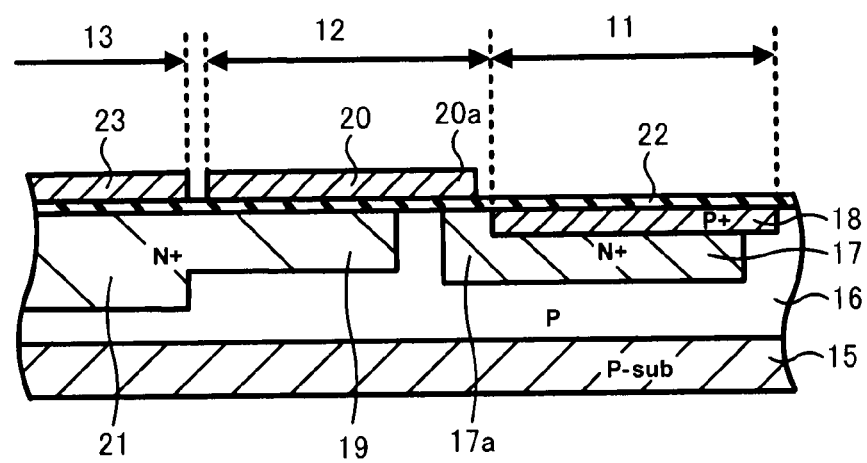
FIG. 2 is a partial cross-sectional view of a pixel unit and a charge accumulating unit, taken along a dashed-dotted line X-X' of FIG. 1.

FIG. 2 is a partial cross-sectional view of the pixel unit 11 and the charge accumulating unit 12, taken along a dashed-dotted line X-X' of FIG. 1. As illustrated in FIG. 2, the pixel unit 11 and the charge accumulating unit 12 are formed in a P-type well 16 which is a P-type first impurity layer provided on the surface of a P-type semiconductor substrate 15.

Each pixel unit 11 includes an N+-type second impurity layer 17 formed on a surface of the well 16, and a P+-type third impurity layer 18 formed on a surface of the second impurity layer 17.

The second impurity layer 17 is formed in the pixel unit 11 such that a portion of the second impurity layer 17 protrudes in the charge accumulating unit 12. The second impurity layer 17 and the well 16 form a pn junction to constitute a photodiode.

The third impurity layer 18 is formed on the surface of the second impurity layer 17 in the pixel unit 11. The third impurity layer 18 is a shield layer for the second impurity layer 17.

In addition, each pixel unit 11 may include, for example, a microlens configured to condense light into the photodiode, a color filter, or the like, as well as the photodiode.

Each charge accumulating unit 12 includes an end portion 17a of the N+-type second impurity layer 17 protruding from the pixel unit 11, an N+-type fourth impurity layer 19, and a gate electrode 20.

The fourth impurity layer 19 is spaced apart from the end portion 17a of the second impurity layer 17 and is also formed on the surface of the well 16 such that the fourth impurity layer 19 is bonded to a fifth impurity layer 21 of the CCD unit 13, which will be described later.

The gate electrode 20 is made of, for example, polysilicon. The gate electrode 20 is formed over the fourth impurity layer 19 and over the well 16 between the fourth impurity layer 19 and the end portion 17a of the second impurity layer 17, with an insulating film 22 disposed therebetween, and an end portion of the gate electrode 20 is formed on the end portion 17a of the second impurity layer 17.

Figure 3:
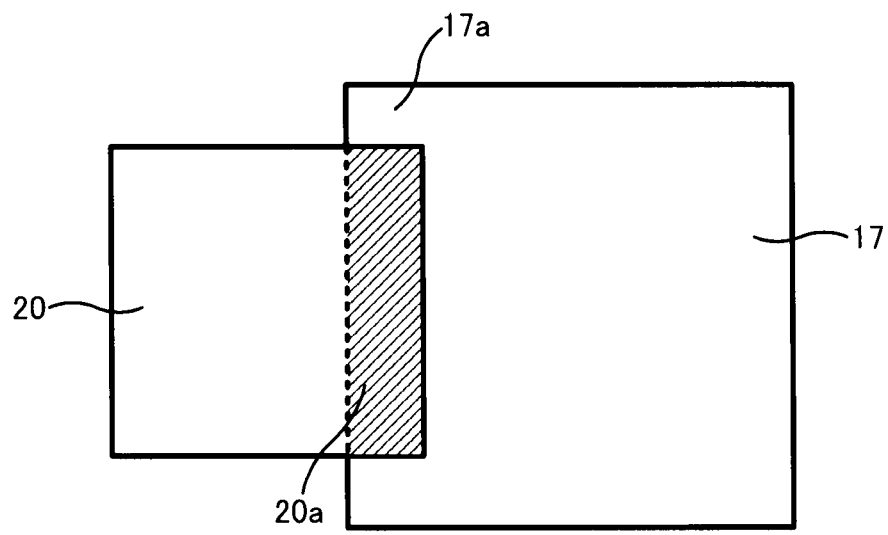
FIG. 3 is a view illustrating a position relation between a second impurity layer and a gate electrode.

FIG. 3 is a view illustrating a position relation between the second impurity layer 17 and the gate electrode 20. As illustrated in FIG. 3, the formed gate electrode 20 is rectangular, and the end portion 20a of the gate electrode 20 is formed to overlap the end portion 17a of the second impurity layer 17. An area of a section (a hatched section of FIG. 3) in which the end portion 20a of the gate electrode 20 and the end portion 17a of the second impurity layer 17 overlap each other, and an impurity concentration of the end portion 17a of the second impurity layer 17 are adjusted such that a potential (Pn2 which will be described later) formed by the end portion 17a of the second impurity layer 17 becomes a depth allowable to a product.

Figure 4:
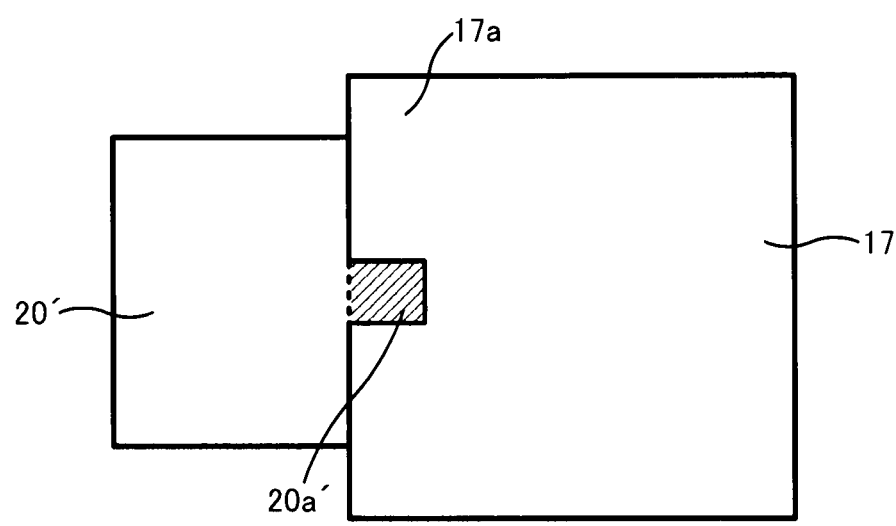
FIG. 4 is a view illustrating a modified example of a gate electrode.

In addition, a modified example of a gate electrode 20' is illustrated in FIG. 4. As illustrated in FIG. 4, the gate electrode 20' may have a shape in which one side of a rectangle is convex. In this case, an end portion 20a' of the gate electrode 20' is the convex section, and the gate electrode 20' may be formed such that the convex end portion 20a' overlaps the end portion 17a of the second impurity layer 17.

Figure 5:
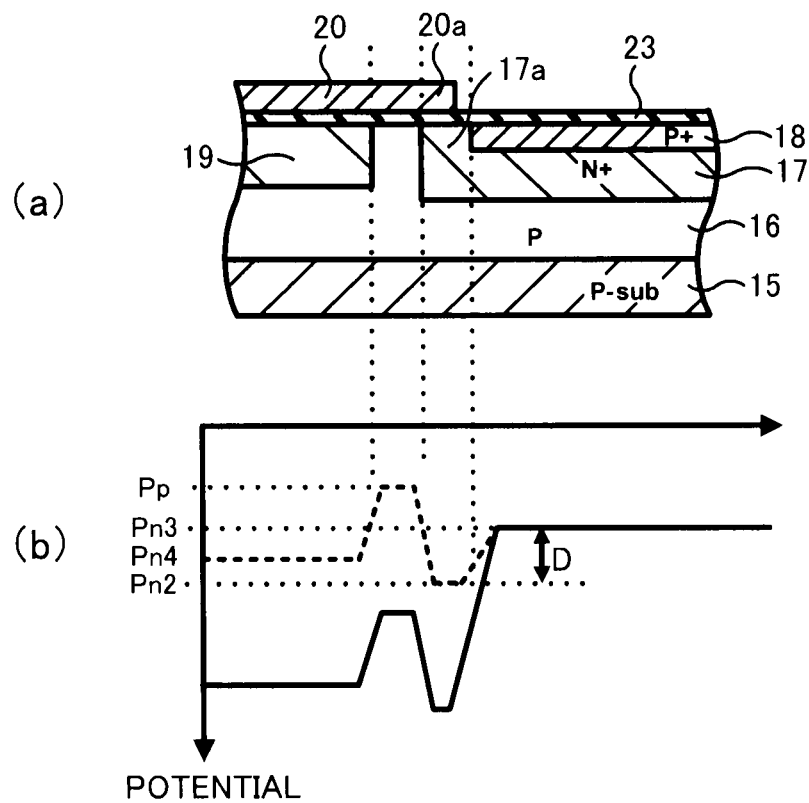

FIGS. 5A and 5B are views describing a method for reading charges from the pixel unit 11 to the charge accumulating unit 12, in which FIG. 5A is an enlarged cross-sectional view of a portion of FIG. 2, and FIG. 5B illustrates potentials formed in the pixel unit 11 and the charge accumulating unit 12.

As illustrated in FIG. 5B, in a state where no voltage is applied to the gate electrode 20, a potential formed by the end portion 17a of the second impurity layer 17 (FIG. 5A) is denoted by Pn2, and a potential formed by the second impurity layer 17 and the third impurity layer 18 (FIG. 5A) is denoted by Pn3. A potential formed by the P-type well 16 (FIG. 5A) is denoted by Pp, and a potential formed by the fourth impurity layer 19 (FIG. 5A) is denoted by Pn4.

As illustrated by a dotted line in FIG. 5B, the potential Pn3 is a potential formed by the N-type second impurity layer 17 and the P-type third impurity layer 18, and the potential Pp is a potential formed by the well 16 which is a P-type impurity layer. Therefore, the potential Pn3 is formed more deeply than the potential Pp. In addition, the potential Pn4 is a potential formed by the N+-type fourth impurity layer 19. Therefore, the potential Pn4 is formed more deeply than the potential Pp. Furthermore, the potential Pn2 between the potential Pn3 and the potential Pp is formed more deeply than the potentials Pn3, Pp.

The potential Pn2 is formed more deeply than the potential Pn3 by D so as to improve the transfer efficiency of charges transferred from the pixel unit 11 to the charge accumulating unit 12. However, if the potential Pn2 is too deep, charges are excessively accumulated in this section, and thus, it may be difficult to satisfy a residual image characteristic allowable to a product. Accordingly, the potential Pn2 is formed to have the depth D allowable to the product.

The depth D of the potential Pn2 may be controlled by adjusting the area of the section in which the end portion 20a of the gate electrode 20 and the end portion 17a of the second impurity layer 17 overlap each other (hereinafter, referred to as overlap area), and the impurity concentration of the end portion 17a of the second impurity layer 17.

Figure 6:
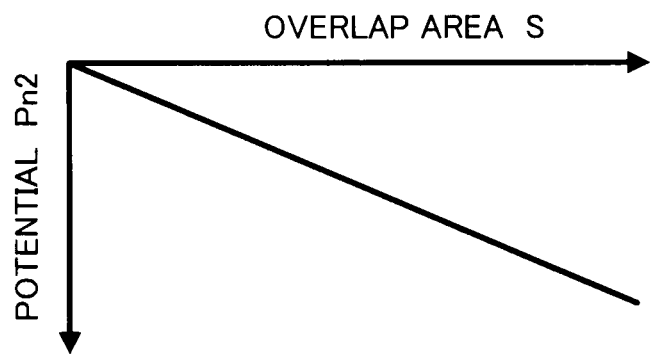
FIG. 6 is a graph illustrating a relation between an overlap area of the gate electrode and the second impurity layer and a potential formed by the second impurity layer, in which a horizontal axis represents a magnitude of the overlap area, and a horizontal axis represents a depth of the potential.

FIG. 6 is a graph illustrating a relation between the overlap area S and the potential Pn2, in which a horizontal axis represents the magnitude of the overlap area S, and a vertical axis represents the depth of the potential Pn2. As illustrated in FIG. 6, as the overlap area S becomes larger, the potential Pn2 becomes deeper in proportion to the overlap area S. Also, this phenomenon is based on a narrow channel effect.

Figure 7:
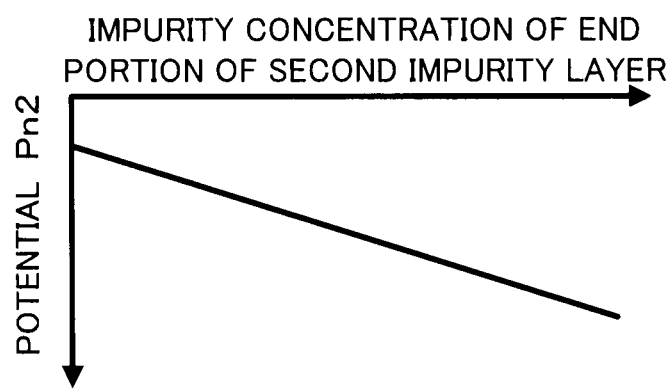
FIG. 7 is a graph illustrating a relation between an impurity concentration of the second impurity layer and a potential formed by the second impurity layer.

In addition, FIG. 7 is a graph illustrating a relation between the impurity concentration of the end portion 17a of the second impurity layer 17 and the potential Pn2, in which a horizontal axis represents the impurity concentration, and the vertical axis represents the depth of the potential Pn2. As illustrated in FIG. 7, as the impurity concentration of the end portion 17a of the second impurity layer 17 becomes higher, the potential Pn2 becomes deeper in proportion to the impurity concentration.

The potential Pn2 is formed more deeply than the potential Pn3 by D by adjusting the overlap area S and the impurity concentration of the end portion 17a of the second impurity layer 17, based on FIGS. 6 and 7.

In addition, a boundary section of Pn3 and Pn2, a boundary section of Pn2 and Pp, and a boundary section of Pp and Pn4 are inclined by a fringe effect, respectively.

In this state, charges generated in the photodiode are transferred up to a section corresponding to the potential Pn2. However, since the potential Pp becomes a potential barrier, no charges are transferred up to the CCD unit 13.

From this state, a predetermined voltage is applied to the gate electrode 20. As illustrated by a solid line in FIG. 5B, the potentials Pn4, Pp and Pn2 formed by various semiconductor layers directly under the gate electrode 20 become deeper. If a voltage is applied such that the potential Pp becomes deeper than the potential Pn3, the potential Pp never becomes a potential barrier. Therefore, charges generated in the photodiode are transferred to the CCD unit 13 through the charge accumulating unit 12.

Figure 8:
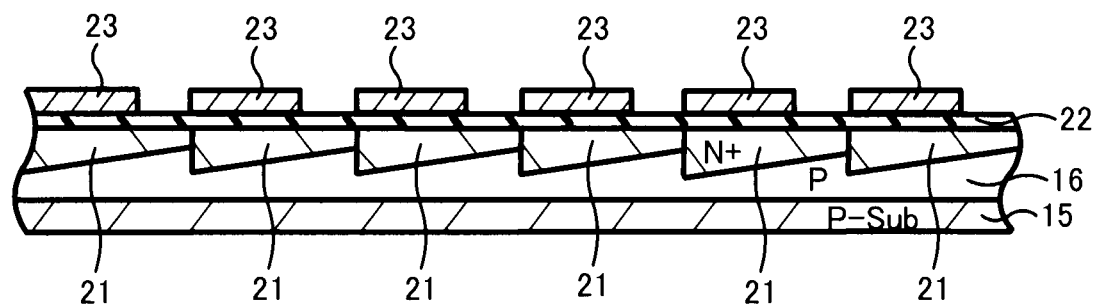
FIG. 8 is a partial cross-sectional view of a charge transferring unit, taken along a dashed-dotted line Y-Y' of FIG. 1.

Next, the CCD unit 13 will be described with reference to FIG. 8. FIG. 8 is a partial cross-sectional view of the CCD unit 13, taken along a dashed-dotted line Y-Y' of FIG. 1.

As illustrated in FIG. 8, the CCD unit 13 is formed by a plurality of N+-type fifth impurity layers 21 formed on the surface of the well 16 in a column shape, and a plurality of rectangular transfer electrodes 23 formed over the respective fifth impurity layers 21, with the insulating film 22 disposed therebetween.

The respective fifth impurity layers 21 are formed to become deeper at a constant rate in a charge transfer direction (a direction from right to left in the drawing). The fifth impurity layer 21 is formed such that a site where impurity is formed most deeply is bonded to a site where impurity is formed most shallowly of the adjacent fifth impurity layer 21.

The respective transfer electrodes 23 are spaced apart from one another. In addition, each transfer electrode 23 is formed such that one side configuring the shape of the electrodes 23 is matched with a site where impurity is deepest in the fifth impurity layers 21. Furthermore, the transfer electrodes 23 are made of, for example, polysilicon.

Such a CCD unit 13 applies an appropriate potential to the transfer electrodes 23 at an appropriate timing, so that a potential formed by the fifth impurity layers 21b is controlled, and transfers the charges. The transferred charges are finally transferred to the FD unit 14 provided at the final stage of the CCD unit 13. The FD unit 14 generates a voltage corresponding to the transferred charge amount. An image output by the solid-state imaging device 10 may be obtained based on the voltage generated by the FD unit 14.

Next, a method for manufacturing a solid-state imaging device according to an embodiment will be described with reference to FIGS. 9 to 12. FIGS. 9 to 12 are cross-sectional views corresponding to FIG. 5A for describing a method for manufacturing a solid-state imaging device according to an embodiment.

Figure 9:
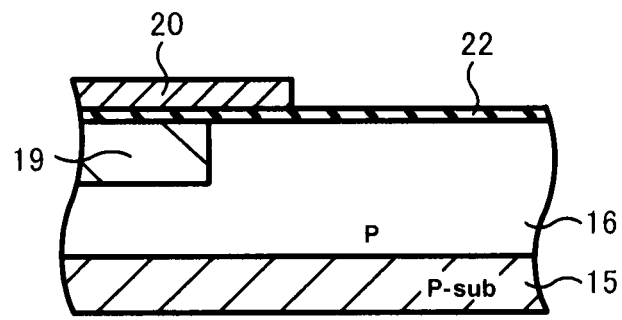
FIG. 9 is a cross-sectional view corresponding to FIG. 5A for describing a method for manufacturing a solid-state imaging device according to an embodiment, and is a view illustrating a process of forming a gate electrode.

First, as illustrated in FIG. 9, a P-type well as a first impurity layer is formed in a predetermined region of a semiconductor substrate 15 made of, for example, P-type silicon. Then, an N+-type fourth impurity layer 19 of a charge accumulating unit 12 is formed in a predetermined region of a surface of the well 16. Thereafter, an insulating film 22 is formed on a surface of the semiconductor substrate 15. A gate electrode 20 is formed over the well 16 including the fourth impurity layer 19, with the insulating film 22 disposed therebetween. The gate electrode 20 is formed by patterning, for example, polysilicon.

In addition, although not illustrated, for example, a fifth impurity layer 21 of a CCD unit 13 may be formed at the same time with the formation of the fourth impurity layer 19, and a transfer electrode 23 of the CCD unit 13 may be formed at the same time with the formation of the gate electrode 20.

Figure 10:
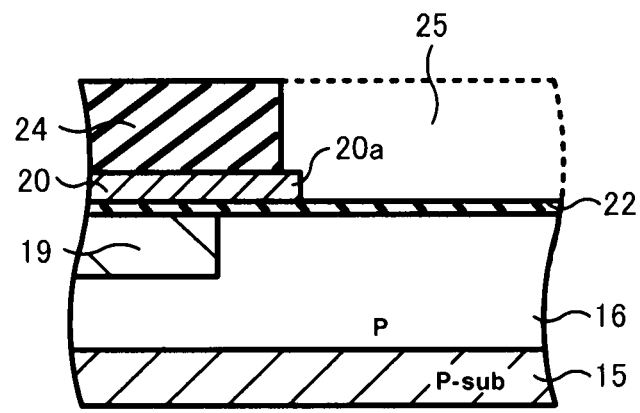
FIG. 10 is a cross-sectional view corresponding to FIG. 5A for describing a method for manufacturing a solid-state imaging device according to an embodiment, and is a view illustrating a process of forming a resist layer.

Then, as illustrated in FIG. 10, a first resist layer 24 is formed on the semiconductor substrate 15 including the gate electrode 20 and the transfer electrode 23. Based on a position of the gate electrode 20, a first opening 25 is formed in the first resist layer 24 such that a region where the second impurity layer 17 is to be formed (FIG. 3) is exposed from the first resist layer 24. An end portion 20a of the gate electrode 20 is exposed from the formed first opening 25.

In a process of forming a second impurity layer 17, which will be described later, the first resist layer 24 including the first opening 25 is used as a mask when impurity is implanted from an oblique direction. Therefore, the first opening 25 is formed out of alignment in a pixel unit 11 direction (right direction in the drawing) slightly away from the region where the second impurity layer 17 is to be formed (FIG. 3).

In addition, since the first opening 25 is formed based on the position of the gate electrode 20, the first opening 25 is formed with high position accuracy.

Figure 11:
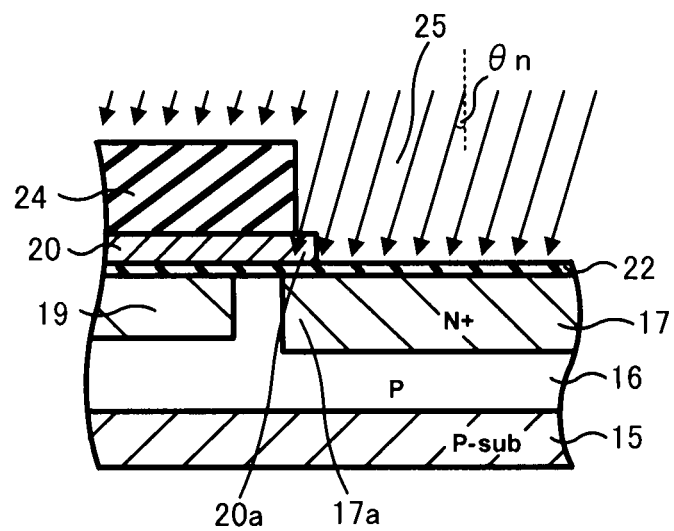
FIG. 11 is a cross-sectional view corresponding to FIG. 5A for describing a method for manufacturing a solid-state imaging device according to an embodiment, and is a view illustrating a process of forming a second impurity layer.

Then, as illustrated in FIG. 11, a second impurity layer 17 is formed on the surface of the well by implanting an N-type impurity into the semiconductor substrate 15 on which the first resist layer 24 is formed. The second impurity layer 17 forms a pn junction with the well 16 to form a photodiode.

A condition that implants the impurity is a condition that the impurity penetrates the end portion 20a of the gate electrode 20 exposed from the first opening 25 of the first resist layer 24. Under this condition, as illustrated by arrows in the drawing, the impurity is implanted from a direction which is inclined by a desired angle θn with respect to a direction from the pixel unit 11 to the charge accumulating unit 12 (left direction in the drawing). The desired angle θn is, for example, about θn=7°-45°, in a case where the semiconductor substrate 15 is a silicon substrate and the surface of the silicon substrate is a (100) plane. In addition, the angle θn is an angle at which a concentration peak in a depth direction of the second impurity layer 17 does not vary depending on positions and the concentration peak is uniform regardless of positions.

In contrast, for example, if the impurity is implanted from a vertical direction) (θn=0°) with respect to the (100) plane of the silicon substrate, a plurality of concentration peaks are formed in the depth direction of the second impurity layer by the alignment of silicon crystal. As a result, a plurality of potentials are formed in the depth direction by the entire second impurity layer including the third impurity layer. Therefore, there is a problem that causes a variation in a transfer characteristic between the pixel unit and the charge accumulating unit.

As such, if the impurity is implanted by penetrating the gate electrode 20 from the oblique direction with respect to the surface of the semiconductor substrate 15, the second impurity layer 17 is formed such that the end portion 17a of the second impurity layer 17 crawls under the end portion 20a of the gate electrode 20.

The overlap area S obtained when the end portion 17a of the second impurity layer 17 crawls under the end portion 20a of the gate electrode 20 is determined by the position of the opening 25 of the first resist layer 24 and the impurity implantation angle θn.

By adjusting the position of the opening 25 of the first resist layer 24 and the impurity implantation angle θn, the second impurity layer 17 is formed such that the overlap area S relative to the gate electrode 20 becomes a desired area. Furthermore, by adjusting an impurity acceleration when implanting the impurity within the scope of the condition that the impurity penetrates the end portion 20a of the gate electrode 20, or by adjusting a thickness of the end portion of the gate electrode 20, the second impurity layer 17 is formed such that the impurity concentration of the end portion 17a of the second impurity layer 17 becomes a desired concentration. In these ways, the second impurity layer 17 is formed such that the potential Pn2 formed by the end portion 17a of the second impurity layer 17 is deeper by D than the potential Pn3 formed by the second and third impurity layers 17 and 18.

In addition, if it is difficult for the potential Pn2 to become the desired potential even by these adjustments, the impurity implantation acceleration and the impurity concentration may be adjusted.

Figure 12:
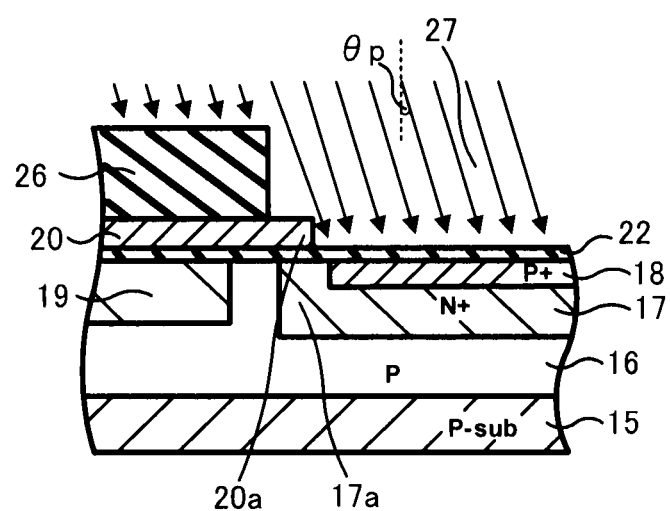
FIG. 12 is a cross-sectional view corresponding to FIG. 5A for describing a method for manufacturing the solid-state imaging device according to an embodiment, and is a view illustrating a process of forming a third impurity layer.

Then, after removing the first resist layer 24, as illustrated in FIG. 12, a second resist layer 26 including a second opening 27 is formed on the semiconductor substrate 15. A region, in which a third impurity layer 18 of the pixel unit 11 is to be formed, is exposed from the second opening 27. Using the second resist layer 26 as a mask, as illustrated by arrows in the drawing, a P-type impurity is implanted into the surface of the second impurity layer 17 from a direction that is inclined by a desired angle θp with respect to a direction from the charge accumulating unit 12 to the pixel unit 11 (right direction in the drawing). In this manner, a P+-type third impurity layer 18 is formed on the surface of the second impurity layer 17.

In the process of forming the third impurity layer 18, the second resist layer 26 including the second opening 27 is used as a mask when impurity is implanted from an oblique direction. Therefore, the second opening 27 is formed out of alignment in a charge accumulating unit 12 direction (left direction in the drawing) slightly away from the region where the third impurity layer 18 is to be formed.

In addition, since the second opening 27 also is formed based on the position of the gate electrode 20, just like the first opening 25 of the first resist layer 24, the second opening 27 is formed with high position accuracy.

As described above, since the P-type impurity is implanted in the oblique direction and the P-type impurity also does not penetrate the gate electrode 20 regardless of the impurity implantation condition, the third impurity layer 18 is formed at a position slightly spaced apart from the end portion 20a of the gate electrode 20. Hence, since the third impurity layer 18 is diffused and protrudes from the second impurity layer 17, the formation of the potential barrier can be suppressed.

Finally, the second resist layer 26 is removed. The above-described solid-state imaging device 10 may be manufactured.

In accordance with the method for manufacturing the solid-state imaging device according to the embodiment of the invention, as described above, the first opening 25 for forming the second impurity layer 17 is formed in the first resist layer 24, based on the position of the gate electrode 20. Using the first resist layer 24 as a mask, the second impurity layer 17 is formed. Therefore, the first opening 25, that is, the second impurity layer 17, may be formed with high position accuracy.

For example, conventionally, the position of the second impurity layer 17 with respect to the gate electrode 20 is misaligned by about ±0.14 μm. However, in accordance with the method according to the embodiment of the invention, the misalignment of the position of the second impurity layer 17 with respect to the gate electrode 20 may be suppressed to about ±0.10 μm.

As described above, in accordance with the method for manufacturing the solid-state imaging device according to the embodiment of the invention, since the second impurity layer 17 can be formed with high position accuracy, the variation in the overlap area S between the end portion 20a of the gate electrode 20 and the end portion 17a of the second impurity layer 17 may be suppressed. As a result, the variation in the residual image characteristic in each charge accumulating unit 12 or the variation in the residual image characteristic in each product is suppressed.

Moreover, in the method for manufacturing the solid-state imaging device according to the embodiment of the present invention, since the impurity for forming the second impurity layer 12 is implanted from the oblique direction, the concentration peak in the depth direction of the second impurity layer 17 can be made uniform. Therefore, the variation in each transfer characteristic between the pixel units 11 and the charge accumulating units 12 is also suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a solid-state imaging device, comprising:

forming an electrode on a semiconductor substrate including a first impurity layer of a first conductivity type on a surface;

forming a second impurity layer of a second conductivity type by implanting an impurity of the second conductivity type into the first impurity layer on the condition that the impurity penetrates an end portion of the electrode, based on a position of the electrode, so that the impurity of the second conductivity type travels in a first direction which is a diagonal direction toward the electrode, the second impurity layer being formed so that a portion of the second impurity layer is disposed under the electrode and the second impurity layer is bonded to the first impurity layer so as to compose a photodiode; and forming a third impurity layer of the first conductivity type at a position spaced apart from the electrode by implanting an impurity of a first conductivity type into the second impurity layer exposed from the electrode, based on a position of the electrode, so that the impurity of the first conductivity type travels in a second direction which is a diagonal direction away from the electrode, wherein the second impurity layer and the third impurity layer are formed so that a first potential of a region including the second impurity layer disposed under the electrode is a predetermined potential greater than a second potential of a region including the third impurity layer, and the first potential is adjusted by the first direction and an overlap area between the second impurity layer and the electrode.

2. The method according to claim 1, wherein the second impurity layer is formed by forming a first resist layer on the semiconductor substrate on which the electrode is formed;

forming a first opening in the first resist layer, based on a position of the electrode, such that a portion of the semiconductor substrate including the end portion of the electrode is exposed from the first opening; and using the first resist layer, in which the first opening is formed, as a mask, and implanting the impurity of the second conductivity type.

3. The method according to claim 2, wherein the overlap area between the second impurity layer and the electrode is adjusted by adjusting an implantation angle of the impurity of the second conductivity type, and a position of the first opening of the first resist layer.

4. The method according to claim 1,
wherein the first potential is adjusted by an impurity concentration of the second impurity layer.

5. The method according to claim 4,
wherein the impurity concentration of the second impurity layer is adjusted by an acceleration of the impurity of the second conductivity type which is implanted into the surface of the semiconductor substrate, and a thickness of the electrode.

6. The method according to claim 1,
wherein the implantation angle of the impurity of the second conductivity type is an angle at which a concentration peak of the formed second impurity layer becomes uniform regardless of positions.

7. The method according to claim 6,
wherein the semiconductor substrate is a silicon substrate, the surface of which is a (100) plane,
the electrode is made of polysilicon, and
the implantation angle of the impurity of the second conductivity type is 7° or more and 45° or less.

8. The method according to claim 1,
wherein the third impurity layer is formed by
forming a second resist layer on the semiconductor substrate on which the electrode is formed;
forming a second opening in the second resist layer, based on the position of the electrode, such that the second impurity layer is exposed from the second opening; and
using the second resist layer, in which the second opening is formed, as a mask, and implanting the impurity of the first conductivity type.

9. The method according to claim 8,
wherein the third impurity layer is formed at a position which is adjusted by adjusting an implantation angle of the impurity of the first conductivity type, and a position of the second opening of the second resist layer.

10. The method according to claim 1,
wherein a fourth impurity layer of the second conductivity type is formed on the first impurity layer so that a third potential of a region including the fourth impurity layer is less than the first potential and is greater than the second potential,
the electrode is formed on at least the fourth impurity layer, and
the second impurity layer is formed at a position spaced apart from the fourth impurity layer.

11. The method according to claim 1,
wherein the electrode is formed over the semiconductor substrate, with an insulating film disposed between the semiconductor substrate and the electrode.

12. The method according to claim 1,
wherein the electrode having a rectangular shape is formed on the semiconductor substrate by patterning.

13. The method according to claim 1,
wherein the electrode in which one side configuring a rectangle has a convex shape is formed on the semiconductor substrate by patterning.

14. The method according to claim 1,
wherein the third impurity layer is formed so that a distance between an end portion of the third impurity layer which is closest to the electrode and an end of the second impurity layer which is disposed under the electrode is a predetermined distance, and
a position of the third impurity layer is controlled by an implantation angle of the impurity of the second conductivity type and an implantation angle of the impurity of the first conductivity type.

* * * * *